United States Patent
Yang

(10) Patent No.: US 9,054,004 B2
(45) Date of Patent: Jun. 9, 2015

(54) PIXEL ISOLATION STRUCTURES IN BACKSIDE ILLUMINATED IMAGE SENSORS

(71) Applicant: Taiwan Semiconductor Manufacturing Company Limited, Hsinchu (TW)

(72) Inventor: Shih-I Yang, New Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/030,548

(22) Filed: Sep. 18, 2013

(65) Prior Publication Data

US 2015/0076648 A1    Mar. 19, 2015

(51) Int. Cl.
*H01L 27/146* (2006.01)

(52) U.S. Cl.
CPC ........ *H01L 27/1463* (2013.01); *H01L 27/1464* (2013.01)

(58) Field of Classification Search
CPC .............. H01L 27/1464; H01L 27/14627; H01L 27/14621; H01L 27/1463
See application file for complete search history.

(56) References Cited

U.S. PATENT DOCUMENTS

| | | | |
|---|---|---|---|
| 8,357,984 B2* | 1/2013 | Mao et al. | 257/447 |
| 8,415,622 B2* | 4/2013 | Suzuki et al. | 250/332 |
| 8,736,006 B1* | 5/2014 | Tsai et al. | 257/432 |
| 8,754,456 B2* | 6/2014 | Roy et al. | 257/292 |
| 2010/0327386 A1* | 12/2010 | Nagai et al. | 257/437 |
| 2013/0105928 A1* | 5/2013 | Costello et al. | 257/432 |
| 2013/0221410 A1* | 8/2013 | Ahn | 257/225 |
| 2014/0077323 A1* | 3/2014 | Velichko et al. | 257/432 |

* cited by examiner

*Primary Examiner* — William Coleman
(74) *Attorney, Agent, or Firm* — Jones Day

(57) ABSTRACT

Systems and methods are provided for fabricating a backside illuminated image sensor including an array of pixels. An example image sensor includes a first pixel, a second pixel, and an isolation structure. The first pixel is disposed in a front side of a substrate and is configured to generate charged carriers in response to light incident upon a backside of the substrate. The second pixel is disposed in the front side of the substrate and is configured to generate charged carriers in response to light incident upon the backside of the substrate. The isolation structure is disposed to separate the second pixel from the first pixel, and extends from the backside of the substrate toward the front side of the substrate. The isolation structure includes a sidewall substantially vertically to the front side of the substrate.

20 Claims, 8 Drawing Sheets

PIXEL ISOLATION STRUCTURES IN BACKSIDE ILLUMINATED IMAGE SENSORS

FIELD

The technology described in this patent document relates generally to semiconductor devices and more particularly to image sensors.

BACKGROUND

An image sensor usually includes an array of pixels, and can be fabricated using complementary metal-oxide-semiconductor (CMOS) processes. A CMOS image sensor may be illuminated from a front side (or a top side) of a silicon die. Because various features related to the CMOS processes, such as metalization, polysilicon, and diffusions, are typically made on the front side of the silicon die, the pixel areas of a front-side illuminated image sensor are often partially obscured, which results in a loss of light reaching photosensitive regions within the pixels and a reduction of the overall sensitivity of the image sensor. A backside illuminated (BSI) CMOS image sensor allows light to be collected from a back side (or a bottom side) of the sensor. The backside of the sensor is relatively unobstructed by many dielectric and/or metal layers involved in the CMOS processes, and thus the overall sensitivity of the image sensor may be improved.

SUMMARY

In accordance with the teachings described herein, systems and methods are provided for fabricating a backside illuminated image sensor including an array of pixels. An example image sensor includes a first pixel, a second pixel, and an isolation structure. The first pixel is disposed in a front side of a substrate and is configured to generate charged carriers in response to light incident upon a backside of the substrate. The second pixel is disposed in the front side of the substrate and is configured to generate charged carriers in response to light incident upon the backside of the substrate. The isolation structure is disposed to separate the second pixel from the first pixel, and extends from the backside of the substrate toward the front side of the substrate. The isolation structure includes a sidewall substantially vertically to the front side of the substrate.

In one embodiment, a backside illuminated image sensor includes a photosensitive region and an isolation structure. The photosensitive region is formed adjacent to a front side of a substrate and configured to generate charged carriers in response to light incident upon a backside of the substrate. The isolation structure is disposed to separate the photosensitive region from other regions of the image sensor, the isolation structure extending from the backside of the substrate toward the front side of the substrate, wherein the isolation structure includes a sidewall substantially vertically to the front side of the substrate.

In another embodiment, a method is provided for fabricating a backside illuminated image sensor including an array of pixels. For example, a first pixel and a second pixel are formed on a substrate to generate charged carriers in response to light incident upon a backside of the substrate. An isolation structure is formed by etching into the backside of the substrate using a chemical solution to separate the second pixel from the first pixel.

DETAILED DESCRIPTION

Figure 1:
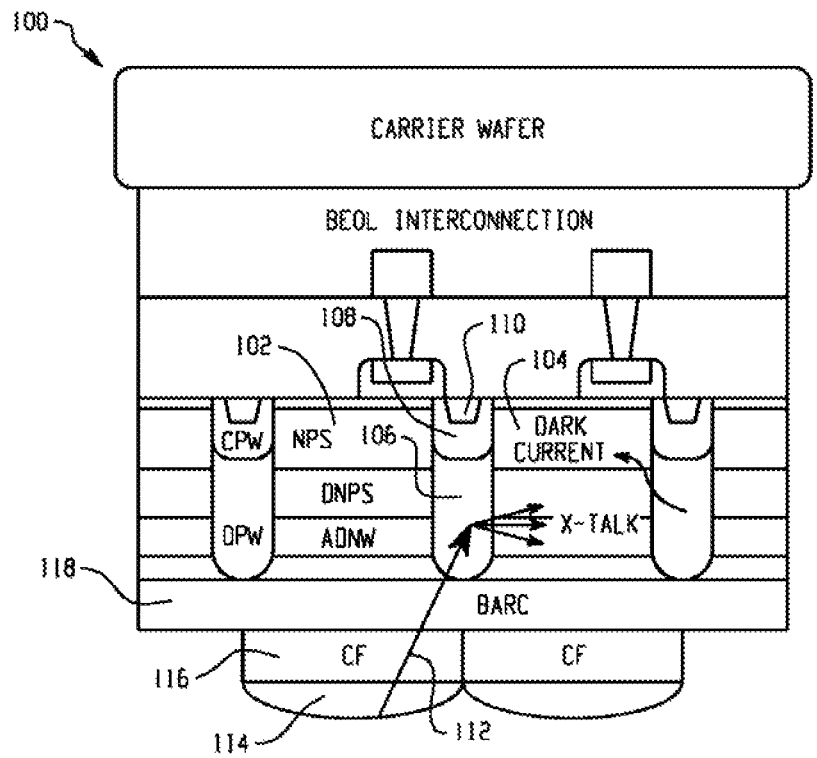
FIG. 1 depicts an example diagram of a backside illuminated (BSI) image sensor.

FIG. 1 depicts an example diagram of a backside illuminated (BSI) image sensor. The image sensor 100 includes an array of pixels, such as pixels 102 and 104. For example, the pixels 102 and 104 may be separated by an isolation structure which includes a deep P-well 106 and a cell P-well 108, and a shallow-trench isolation region 110. However, such an isolation structure may not be effective in reducing an undesirable effect—cross talk (i.e., electron-hole pairs generated in a pixel in response to incident light being captured by a neighboring pixel) which reduces color fidelity of the output of the image sensor. For example, the barrier between the pixel 102 and the deep P-well 106 may not be sufficient to prevent electrons/holes generated in the pixel 102 from drifting or diffusing to the neighboring pixel 104. Furthermore, incident light may travel through micro-lens 114, a color filter 116 and a bottom anti-reflective coating (BARC) 118 and fall in the deep P-well 106. Electrons/holes generated in the deep P-well 106 may drift or diffuse to either the pixel 102 or the neighboring pixel 104, which may cause more noises.

Figure 2:
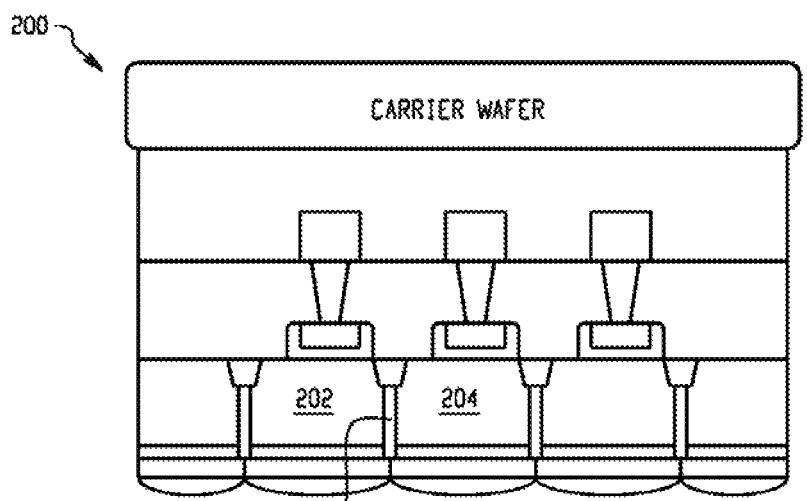
FIG. 2 depicts an example diagram of a BSI image sensor with a deep-groove isolation structure.
Figure 5:
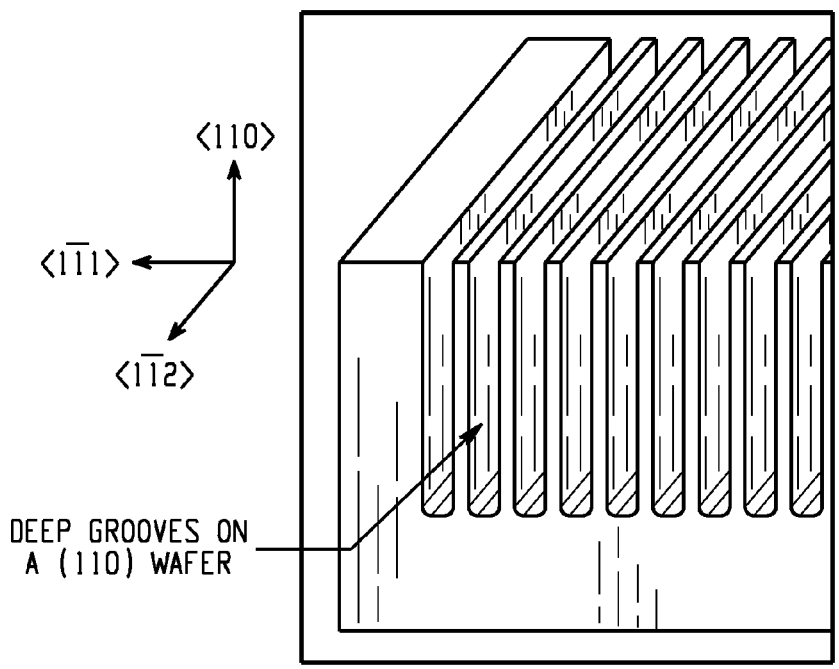
FIG. 5 depicts an example diagram showing deep grooves formed on a <110> silicon substrate.

FIG. 2 depicts an example diagram of a BSI image sensor with a deep-groove isolation structure. As shown in FIG. 2, the image sensor 200 may include an array of pixels, such as pixels 202 and 204. An isolation structure 206 may be implemented to separate the pixels 202 and 204. In some embodiments, the isolation structure 206 may be formed by etching into a backside of the image sensor 200 using a chemical solution. For example, the isolation structure 206 may include a deep groove formed by wet etching of a silicon substrate with a crystal orientation of <110>. The groove may be defined by multiple side walls and a base spanning between the sidewalls (e.g., as shown in FIG. 5). As an example, a potassium hydroxide (KOH) solution, or a tetramethylammonium hydroxide (TMAH) solution may be used for etching the silicon substrate.

Figure 3:
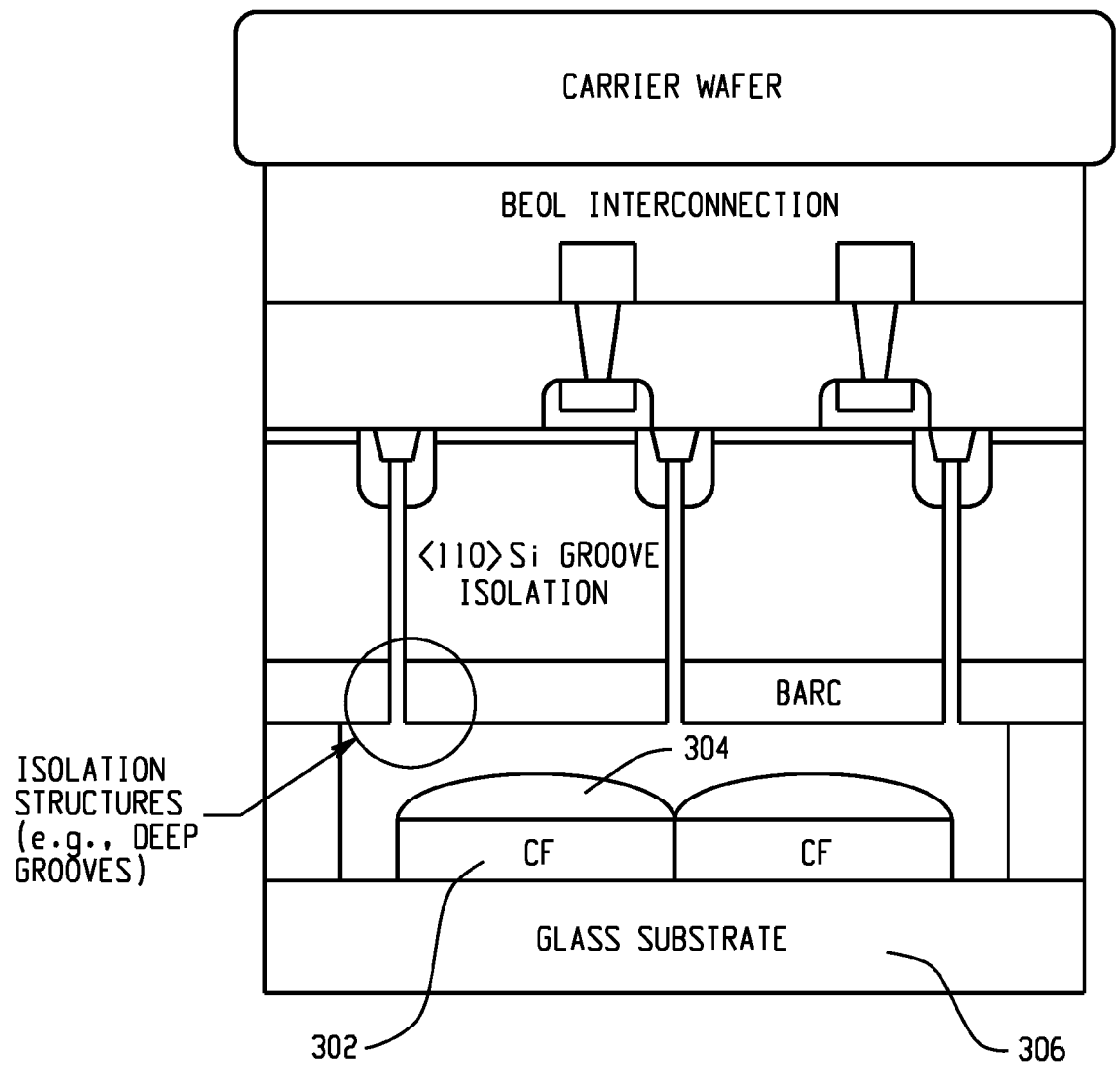
FIG. 3 depicts another example diagram of a BSI image sensor with a deep-groove isolation structure.

In one embodiment, the pixels of the image sensor 200 (e.g., the pixels 202 and 204) may be fabricated using epitaxial growth, similar to what are shown in FIG. 1. For example, a pixel of the image sensor 200 may include a gradual N-type doping profile. In another embodiment, the pixels of the image sensor 200 may be fabricated using implantation (e.g., P-type implantation), as shown in FIG. 3, where color filters 302 and micro-lens 304 may be placed on a glass substrate 306.

Figure 4A:
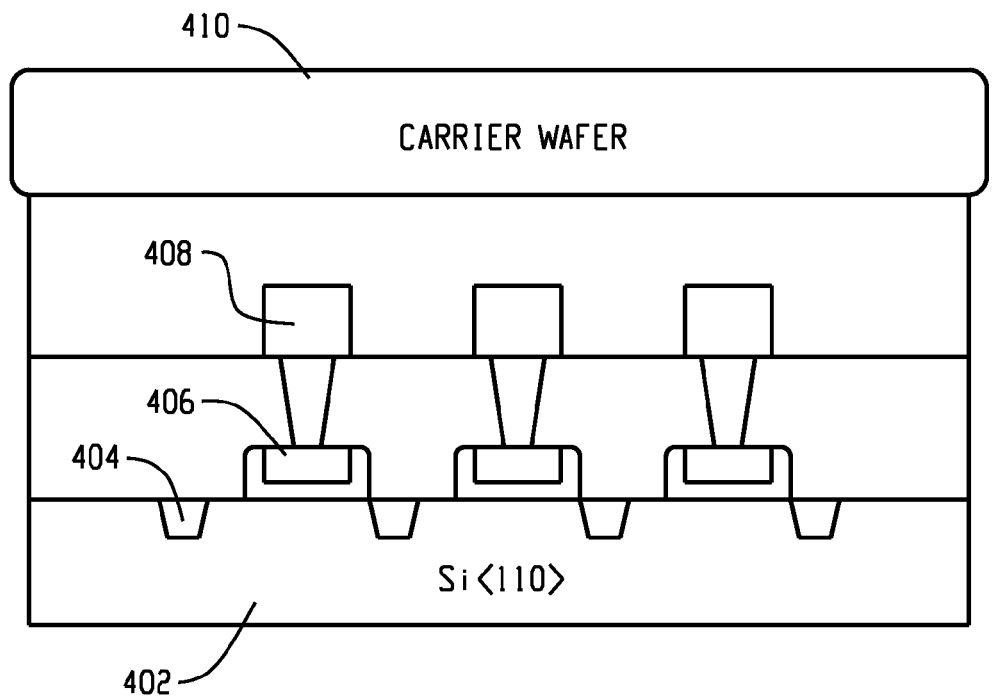
FIG. 4A-4D depict example diagrams for fabricating a BSI image sensor with a deep-groove isolation structure.

FIG. 4A-4D depict example diagrams for fabricating a BSI image sensor with a deep-groove isolation structure. As shown in FIG. 4A, a <110> silicon substrate 402 may be used for fabricating the BSI image sensor. For example, one or more CMOS processes, such as photolithography, etching, and metal deposition, may be performed on the silicon substrate 402. As a result, shallow-trench isolation regions 404, floating gate structures 406 and multi-layer interconnect structures 408 may be formed on the substrate 402. The resulting structure may be attached to a carrier wafer 410 (e.g., a glass plate), e.g., through one or more wafer bonding processes. The silicon substrate 402 may be reduced to a predetermined thickness, e.g., using a chemical-mechanical polishing/planarization process. As an example, the thickness of the silicon substrate 402 may be reduced to about 1 micron to about 3 microns.

Figure 4B:
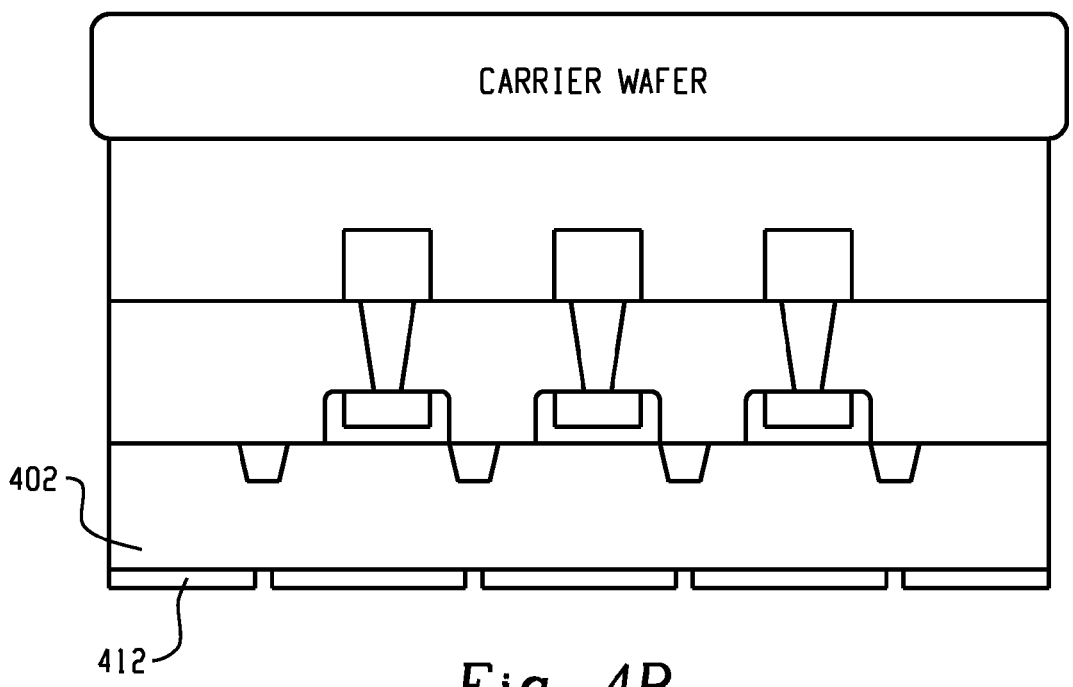
Figure 4C:
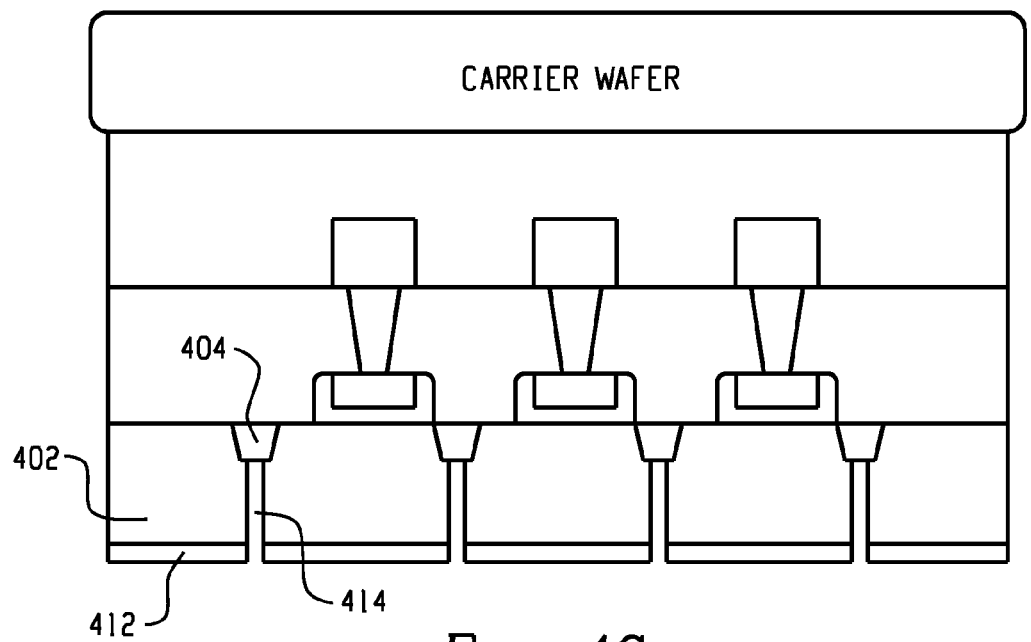

As shown in FIG. 4B, an anti-reflective layer 412 may be deposited on a backside of the substrate 402. Then, the layer 412 may be patterned as a hard mask, e.g., through photolithography and etching. As shown in FIG. 4C, anisotropic etching of the substrate 402 may be carried out to form deep grooves 414 using a chemical solution, such as a KOH solution or a TAMH solution. For example, the KOH solution with a predetermined concentration (e.g., about 34 wt %) may be used at a predetermined etching temperature (about 71° C.). The etch rate may be about 1.3 micron per minute. In another example, the TMAH solution with a predetermined concentration (e.g., about 20 wt %) may be used at a predetermined temperature (about 80° C.), and the etch rate may be about 1.1 micron per minute. As an example, the lateral etching ratio may be in a range of about 1:30 to 1:160.

Figure 4D:
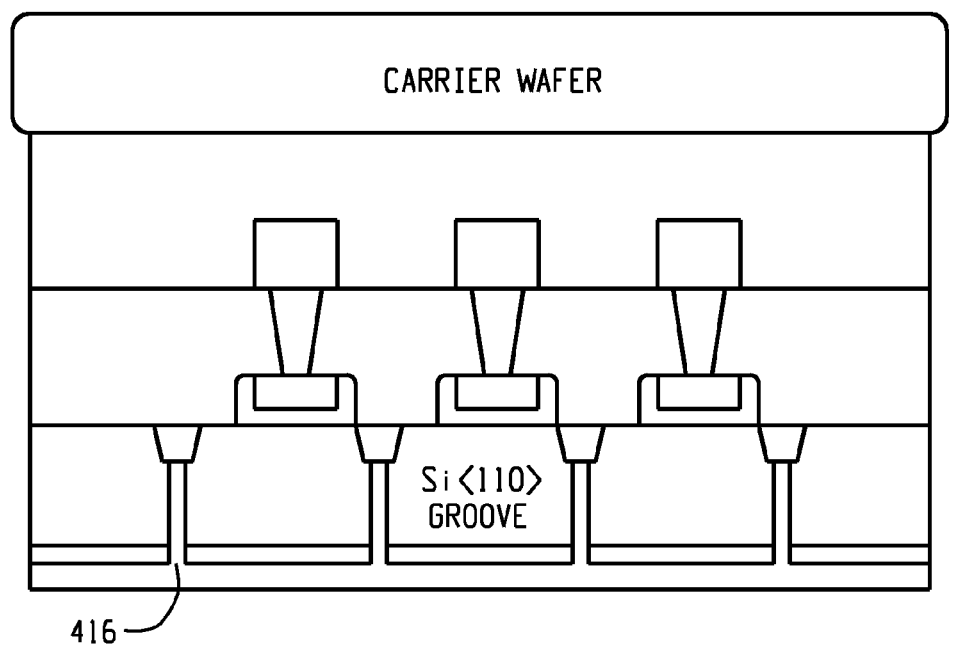

As an example, the deep grooves 414 extend from a bottom surface of the layer 412 towards the shallow-trench isolation regions 404. For example, the chemical solution may etch the substrate 402 along a <111> interface, and form the deep grooves 414 with smooth side walls, as shown in FIG. 5. In another example, the grooves 414 may have a width in a range of about 50 nm to about 110 nm, and a depth of about 1 micron to about 3 microns. Referring to FIG. 4D, the deep grooves 414 may be filled with one or more dielectric materials (e.g., silicon diode), in some embodiments.

Figure 6A:
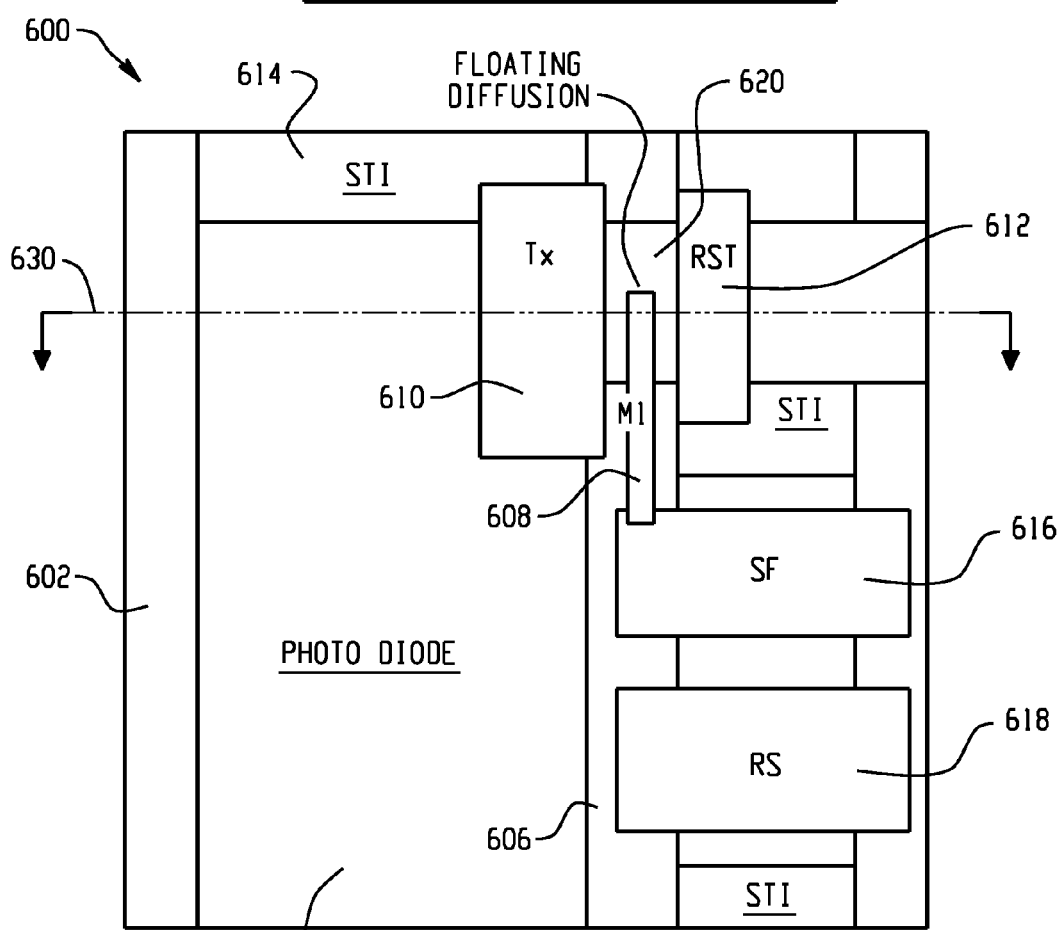
FIGS. 6A-6D depict example diagrams of a pixel of a BSI image sensor with a deep-groove isolation structure.

FIGS. 6A-6D depict example diagrams of a pixel of a BSI image sensor with a deep-groove isolation structure. As shown in FIG. 6A, the pixel 600 includes a deep-groove isolation structure 602 which separates a photodiode region 604 from a neighboring pixel in the image sensor. In addition, the pixel 600 includes another deep-groove isolation structure 606 to separate the photodiode region 604 from other devices of the pixel 600. Furthermore, the pixel 600 includes a metal layer 608, a transfer transistor 610, a reset transistor 612, one or more shallow-trench isolation regions 614, a source follower transistor 616, a row-select transistor 618, and a floating diffusion region 620. For example, the deep-groove isolation structures 602 and 606 may include deep grooves formed by etching into the backside of the pixel using a chemical solution. In another example, the deep-groove isolation structures 602 and 606 may be formed by filling the etched grooves with one or more dielectric materials (e.g., silicon oxide).

Figure 6B:
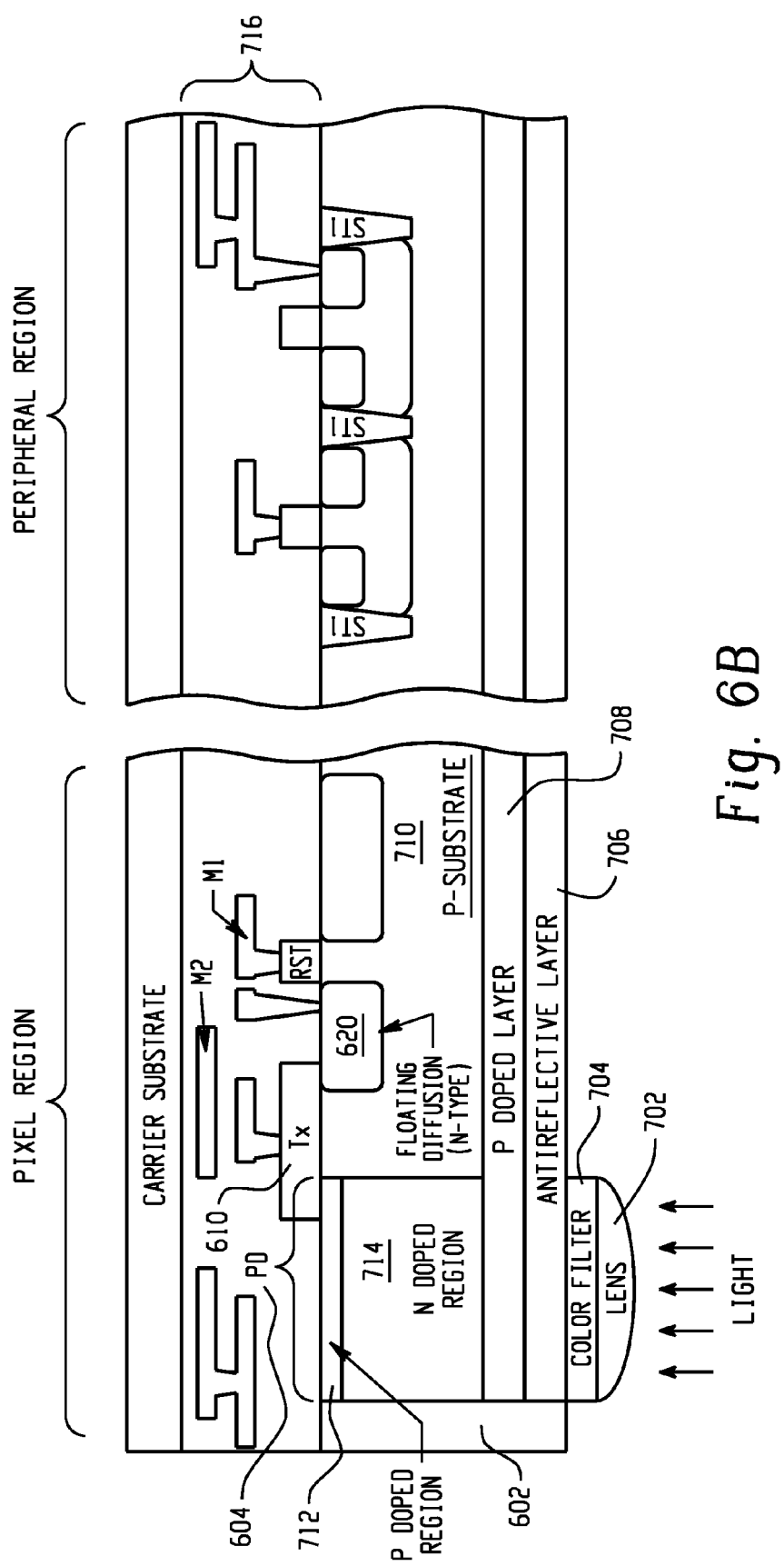

FIG. 6B depicts a cross-sectional view of the pixel 600 along a cutline 630. As shown in FIG. 6B, in the pixel region, micro-lens 702 and a color filter 704 may be formed on a backside of the pixel 600. An antireflective layer 706 and a P-doped layer 708 may be formed on a P-type substrate 710. The photodiode region 604 may include a N-doped region 712 and a P-doped region 714. The floating diffusion region 620 may be formed at the top of the substrate 710. One or more interconnection structures may be formed in an interconnection layer 716 to connect devices in different layers of the pixel region and/or the peripheral region.

Figure 6C:
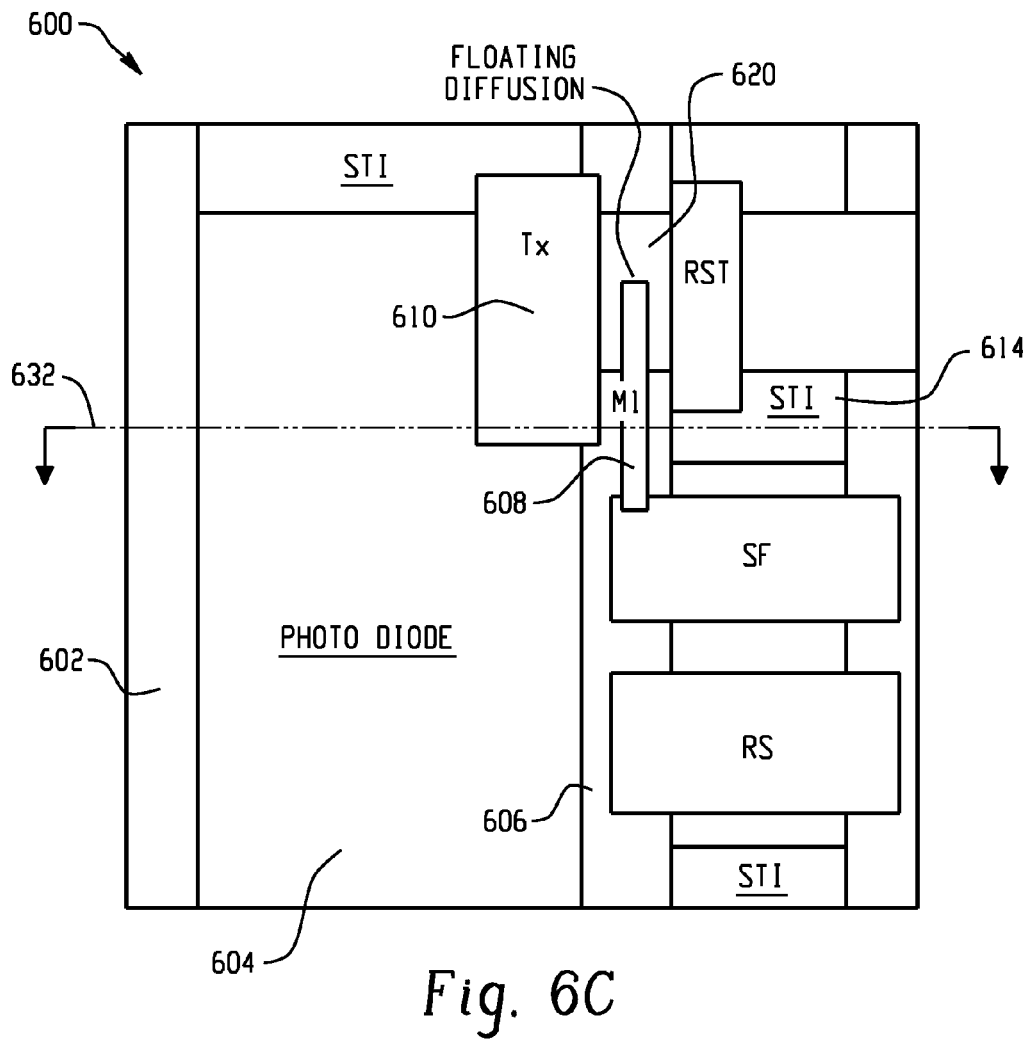
Figure 6D:
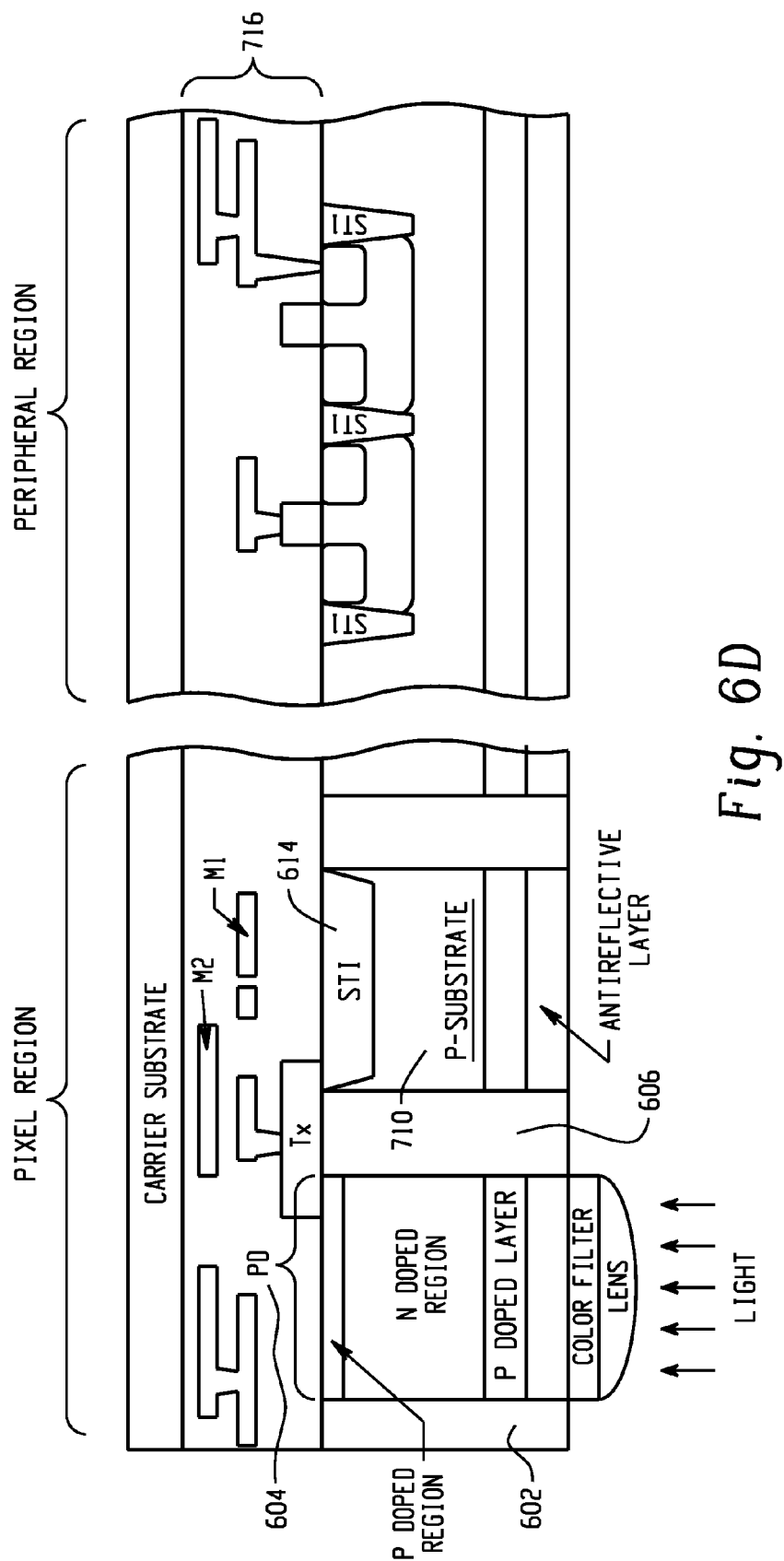

FIG. 6D depicts a cross-sectional view of the pixel 600 along a cutline 632 as shown in FIG. 6C. As shown in FIG. 6D, in addition to the isolation structure 602 which separates the photodiode region 604 from another pixel in the image sensor, the deep-groove isolation structure 606 may separate the photodiode region 604 from other semiconductor structures in the pixel 600, e.g., to prevent electrons/holes generated in other semiconductor structures in response to incident light from drifting or diffusing into the photodiode region 604. For example, other regions in the substrate 710 may be separated from the photodiode region 604.

Figure 7:
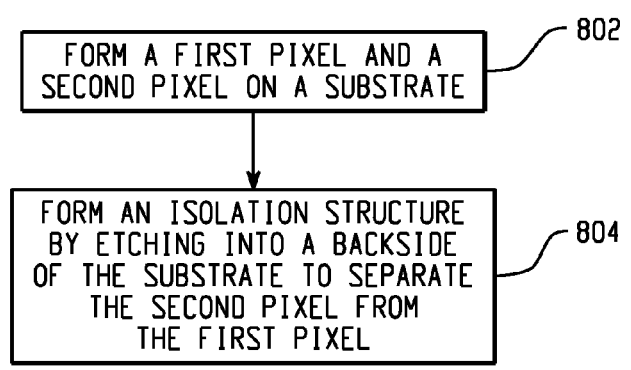
FIG. 7 depicts an example flow chart for fabricating a backside illuminated image sensor including an array of pixels.

FIG. 7 depicts an example flow chart for fabricating a backside illuminated image sensor including an array of pixels. For example, at 802, a first pixel and a second pixel are formed on a substrate to generate charged carriers in response to light incident upon a backside of the substrate. At 804, an isolation structure is formed by etching into the backside of the substrate using a chemical solution to separate the second pixel from the first pixel. For example, the substrate includes a silicon wafer in a <110> crystal orientation. The isolation structure includes a groove formed by etching into a backside of the silicon substrate. As an example, the isolation structure may be formed by filling the groove with one or more dielectric materials.

This written description uses examples to disclose the invention, include the best mode, and also to enable a person skilled in the art to make and use the invention. The patentable scope of the invention may include other examples that occur to those skilled in the art. One skilled in the relevant art will recognize that the various embodiments may be practiced without one or more of the specific details, or with other replacement and/or additional methods, materials, or components. Well-known structures, materials, or operations may not be shown or described in detail to avoid obscuring aspects of various embodiments of the invention. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. For example, a particular layer described herein may include multiple components which are not necessarily connected physically or electrically. Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The term "under" as used herein (including in the claims) may not indicate that a first layer "under" a second layer is directly under and in immediate contact with the second layer unless such is specifically stated; there may be a third layer or other structure between the first layer and the second layer under the first layer. The embodiments of a device or article described herein can be manufactured, used, or shipped in a number of positions and orientations. Persons skilled in the art will recognize various equivalent combinations and substitutions for various components shown in the figures.

What is claimed is:

1. A backside illuminated image sensor including an array of pixels, comprising:
   a first pixel disposed in a front side of a substrate and configured to generate charged carriers in response to light incident upon a backside of the substrate;
   a second pixel disposed in the front side of the substrate and configured to generate charged carriers in response to light incident upon the backside of the substrate; and
   an anti-reflective layer on the backside of the substrate; and
   a first isolation structure disposed to separate the second pixel from the first pixel, the first isolation structure extending from the backside of the substrate toward the front side of the substrate, wherein the first isolation structure includes a first sidewall substantially vertically to the front side of the substrate,
   wherein the first isolation structure separates a region of the anti-reflective layer corresponding to the first pixel and another region of the anti-reflective layer corresponding to the second pixel.

2. The image sensor of claim 1, wherein the first pixel and the second pixel are formed on a silicon substrate with a <110> crystal orientation.

3. The image sensor of claim 1, wherein a thickness of the substrate is about 1 micron to about 3 microns.

4. The image sensor of claim 1, wherein a crystal orientation of the first sidewall is approximately <111>.

5. The image sensor of claim 1, wherein the first isolation structure includes a groove.

6. The image sensor of claim 1, wherein the first pixel further includes:
   a photosensitive region;
   a semiconductor structure; and
   a second isolation structure disposed to separate the semiconductor structure from the photosensitive region, the second isolation structure extending from the backside of the substrate toward the front side of the substrate, wherein the second isolation structure includes a second sidewall substantially vertically to the front side of the substrate.

7. The image sensor of claim 1, further comprising:
   a third pixel disposed in the front side of the substrate and configured to generate charged carriers in response to light incident upon the backside of the image sensor; and
   a second isolation structure disposed to separate the third pixel from the second pixel, the second isolation structure extending from the backside of the substrate toward the front side of the substrate, wherein the second isolation structure includes a second sidewall substantially vertically to the front side of the substrate.

8. The image sensor of claim 5, wherein the first isolation structure includes one or more dielectric materials filled in the groove.

9. The image sensor of claim 5, wherein the groove includes a void defined by multiple sidewalls and a base spanning between the sidewalls.

10. The image sensor of claim 5, wherein the groove has a width in a range of about 50 nm to about 110 nm, and a depth of about 1 micron to about 3 microns.

11. The image sensor of claim 7, wherein:
    the third pixel is formed on the substrate; and
    the second isolation structure includes a groove having an opening on the backside of the substrate.

12. The image sensor of claim 11, wherein the second isolation structure includes one or more dielectric materials filled in the groove.

13. A backside illuminated image sensor, comprising:
    a photosensitive region formed adjacent to a front side of a substrate and configured to generate charged carriers in response to light incident upon a backside of the substrate;
    an anti-reflective layer on the backside of the substrate; and
    an isolation structure disposed to separate the photosensitive region from other regions of the image sensor, the isolation structure extending from the backside of the substrate toward the front side of the substrate, wherein the isolation structure includes a sidewall substantially vertically to the front side of the substrate,
    wherein the isolation structure separates a region of the anti-reflective layer corresponding to the photosensitive region and another region of the anti-reflective layer corresponding to the other regions of the image sensor.

14. The image sensor of claim 13, wherein the isolation structure includes a groove.

15. A method for fabricating a backside illuminated image sensor including an array of pixels, the method comprising:
    forming a first pixel and a second pixel on a substrate to generate charged carriers in response to light incident upon a backside of the substrate;
    forming an anti-reflective layer on the backside of the substrate; and
    etching into the backside of the substrate using a chemical solution and the anti-reflective layer as a hard mask to provide a groove between the first pixel and the second pixel; and
    forming an isolation structure in the groove to separate a region of the anti-reflective layer corresponding to the first pixel and another region of the anti-reflective layer corresponding to the second pixel.

16. The method of claim 15, wherein the substrate includes a silicon wafer in a <110> crystal orientation.

17. The method of claim 15, wherein forming the isolation structure includes: forming a groove by etching into a backside of the substrate.

18. The method of claim 17, wherein the groove includes a void defined by multiple sidewalls and a base spanning between the sidewalls.

19. The method of claim 17, wherein forming the isolation structure further includes: filling the groove with one or more dielectric materials.

20. The method of claim 17, wherein the groove is formed by etching using a potassium hydroxide (KOH) solution, or a tetramethylammonium hydroxide (TMAH) solution.

* * * * *